United States Patent
Niwa et al.

(10) Patent No.: US 6,919,157 B2
(45) Date of Patent: Jul. 19, 2005

(54) POSITIVE TYPE RADIATION-SENSITIVE COMPOSITION AND PROCESS FOR PRODUCING PATTERN WITH THE SAME

(75) Inventors: Hiroyuki Niwa, Otsu (JP); Kazutaka Tamura, Otsu (JP); Masahide Senoo, Takatsuki (JP)

(73) Assignee: Toray Industries, Inc., Tokyo (JP)

( * ) Notice: Subject to any disclaimer, the term of this patent is extended or adjusted under 35 U.S.C. 154(b) by 337 days.

(21) Appl. No.: 10/069,136
(22) PCT Filed: Jan. 19, 2001
(86) PCT No.: PCT/JP01/00315
§ 371 (c)(1), (2), (4) Date: Feb. 22, 2002
(87) PCT Pub. No.: WO01/98833
PCT Pub. Date: Dec. 27, 2001

(65) Prior Publication Data
US 2003/0003392 A1 Jan. 2, 2003

(51) Int. Cl.$^7$ .............................................. G03F 7/004
(52) U.S. Cl. .................................... 430/270.1; 430/296
(58) Field of Search .............................. 430/270.1, 296

(56) References Cited

U.S. PATENT DOCUMENTS

| 5,688,628 A | 11/1997 | Oie et al. |
| 5,962,185 A | 10/1999 | Park et al. |
| 5,989,775 A | 11/1999 | Park et al. |

FOREIGN PATENT DOCUMENTS

| EP | 0 908 473 | 4/1999 | |
| JP | 3-98051 | 4/1991 | |
| JP | 4-136856 | 5/1992 | |
| JP | 07295221 A | * 11/1995 | ........... G03F/7/039 |
| JP | 10-171122 | 6/1998 | |
| JP | 10-287712 | 10/1998 | |
| WO | WO 00/16160 | 3/2000 | |

OTHER PUBLICATIONS

English language abstract of JP 04–136856.*
English language abstract of JP 7–295221.*

* cited by examiner

*Primary Examiner*—Amanda Walke
(74) *Attorney, Agent, or Firm*—Morrison & Foerster LLP

(57) ABSTRACT

The present invention relates to a positive-working radiation-sensitive composition which is characterized in that it contains a compound meeting any of conditions a1) to a3), and b) an acid generator which generates acid by irradiation with radiation; and also to a method for the production of a resist pattern employing same.

a1) A compound wherein a carboxyl group is protected by an acid labile group represented by general formula (1)

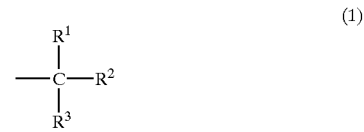

($R^1$ and $R^2$ are aromatic rings, and $R^3$ represents an alkyl group, a substituted alkyl group, a cycloalkyl group or an aromatic ring. $R^1$ to $R^3$ may be the same or different.)

a2) A compound in which an alkali-soluble group is protected by an acid labile group represented by general formula (2)

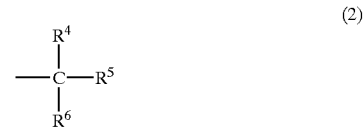

($R^4$ to $R^6$ are each an alkyl group, a substituted alkyl group, a cycloalkyl group or an aromatic ring, and at least one of $R^4$ to $R^6$ is an aromatic ring with an electron-donating group. $R^4$ to $R^6$ may be the same or different.)

a3) A compound in which an alkali-soluble group is protected by an acid labile group a, and either acid labile group a has an alkali-soluble group or acid labile group a has an alkali-soluble group protected by an acid labile group b.

With this constitution, it is possible by means of the present invention to obtain a positive-working radiation-sensitive composition of high sensitivity having a resolution which enables sub-quarter micron pattern processing to be carried out.

14 Claims, No Drawings

POSITIVE TYPE RADIATION-SENSITIVE COMPOSITION AND PROCESS FOR PRODUCING PATTERN WITH THE SAME

TECHNICAL FIELD

The present invention relates to a positive-working radiation-sensitive composition used in the production of semiconductor integrated circuits, lithography masks and the like.

TECHNICAL BACKGROUND

Along with the increasing degree of integration in recent years, patterns are becoming ever finer in fields such as the production of semiconductor circuits and lithography masks. As a result, resist materials of still higher resolution levels are required, and it has become necessary to be able to carry out the processing of <0.25 μm sub-quarter micron patterns at high sensitivity. Carrying out such minute processing by conventional lithography using a comparatively long wavelength light source is difficult, and lithography employing higher energy X-rays, electron beams and vacuum ultraviolet is being investigated, and resists corresponding to these radiation sources are being demanded.

As known resist materials having the characteristics of high sensitivity and high resolution corresponding to such sources of radiation exposure, chemically amplified resists have been extensively investigated. Chemically amplified resists are resists which possess a mechanism whereby acid is generated in exposed regions due to the action of a photoacid generator, and the solubility of the exposed regions is modified by the catalytic action of this acid. Hitherto, amongst such chemically-amplified resists those showing comparatively good resist properties have employed alkali-soluble resins in which the alkali-soluble groups are protected by acid labile groups such as the tert-butyl group, the 1,1-diphenylethyl group (U.S. Pat. No. 5,688,628), the trityl group (JP-A-6-83057) and other such tertiary ester groups, the tert-butoxycarbonyl group, the acetal group and the like.

However, there is an opposing relation between resolution and sensitivity, and there have been problems such as inadequate sensitivity when obtaining a resolution sufficient for carrying out sub-quarter micron pattern processing.

DISCLOSURE OF THE INVENTION

The present invention relates to a positive-working radiation-sensitive, composition which is characterized in that it contains any of compounds a1) to a3), plus b) an acid generator which generates acid by exposure to radiation; and to a method of producing a resist pattern employing same.

a1) A compound in which a carboxyl group is protected by an acid labile group represented by general formula (1)

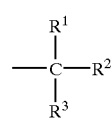

($R^1$ and $R^2$ are aromatic rings, and $R^3$ represents an alkyl group, a substituted alkyl group, a cycloalkyl group or an aromatic ring; and $R^1$ to $R^3$ may be the same or different.)

a2) A compound in which an alkali-soluble group is protected by an acid labile group represented by general formula (2).

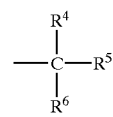

($R^4$ to $R^6$ are each an alkyl group, a substituted alkyl group, a cycloalkyl group or an aromatic ring, and at least one of $R^4$ to $R^6$ is an aromatic ring with an electron-donating group. $R^4$ to $R^6$ may be the same or different.)

a3) A compound in which an alkali-soluble group is protected by an acid labile group a, and the acid labile group a has an alkali-soluble group or alternatively the acid labile group a has an alkali-soluble group protected by an acid labile group b.

OPTIMUM FORM FOR PRACTISING THE INVENTION

The positive-working radiation-sensitive composition of the present invention comprises any of compounds a1) to a3), plus b) an acid generator which generates acid by exposure to radiation.

Compound a1) is a compound wherein a carboxyl group is protected by an acid labile group represented by general formula (1). $R^1$ and $R^2$ are aromatic rings, and $R^3$ represents an alkyl group, a substituted alkyl group, a cycloalkyl group or an aromatic ring. $R^1$ to $R^3$ may be the same or different. Specific examples of $R^1$ and $R^2$ are the phenyl group, naphthyl group, pyridyl group, furyl group and thienyl group. Specific examples of $R^3$ are the methyl group, ethyl group, propyl group, butyl group, methoxymethyl group, ethoxybutyl group, hydroxy-ethyl group and cyclohexyl group, and also the groups cited above as specific examples of $R^1$. By introducing two or more aromatic rings onto the tertiary carbon bonded to the oxygen, it is possible by the aromatic ring resonance effect to facilitate the elimination reaction of the labile group by the acid, and the resist sensitivity is markedly enhanced compared to the case where there are no aromatic rings on the tertiary carbon or just one. Furthermore, by introducing several aromatic rings, the dry etching resistance is enhanced.

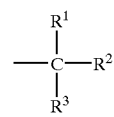

Compound a2) is a compound in which an alkali-soluble group is protected by an acid labile group represented by general formula (2). $R^4$ to $R^6$ are each an alkyl group, a substituted alkyl group, a cycloalkyl group or an aromatic ring, and at least one of $R^4$ to $R^6$ is an aromatic ring with an electron-donating group. $R^4$ to $R^6$ may be the same or different. Here, the electron-donating group is a group having a stronger tendency to donate electrons than hydrogen, and examples include acyloxy groups, amino groups, alkyl groups and alkoxy groups. The electron-donating groups which are preferably used from amongst these are acyloxy group with 2 to 6 carbons, alkyl groups with 1 to 4 carbons and alkoxy groups with 1 to 6 carbons, of which the alkoxy groups with 1 to 6 carbons are most preferred. There may also be two or more electron-donating groups on one aromatic ring. Specific examples of aromatic rings with an electron-donating group are the 4-acetyloxyphenyl group, 4-acetyloxynaphthyl group, 3-benzyloxyphenyl group, 4-dimethylaminophenyl group, 2-dimethylaminophenyl group, 4-aminonaphthyl group, p-tolyl group, m-tolyl group, o-tolyl group, 2,4-dimethylphenyl group, 2,4,6-trimethylphenyl group, 4-tert-butylphenyl group, 4-methylnaphthyl group, 4-methoxyphenyl group, 2-methoxyphenyl group, 3-ethoxyphenyl group, 4-tert-butoxyphenyl group, 4-phenoxyphenyl group, 4-methoxynaphthyl group, 3-isopropoxyphenyl group, 4-methoxy-3-methylphenyl group, 3,5-dimethoxyphenyl group and the like. Furthermore, as specific examples of the remaining groups amongst $R^4$ to $R^6$ other than the aromatic ring with an electron-donating group, there are the methyl group, ethyl group, propyl group, butyl group, methoxymethyl group, ethoxybutyl group, hydroxyethyl group, cyclohexyl group and phenyl group. When an aromatic ring on a tertiary carbon bonded to oxygen possesses an electron-donating group, the positive charge of the carbocation produced at the time of deprotection is stabilized, so deprotection is facilitated and the resist sensitivity is enhanced. Furthermore, the carboxyl group and the phenolic hydroxyl group are preferred as the alkali-soluble group in compound a2).

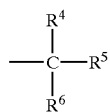
(2)

A structure represented by the following general formula (3) is preferred as the aromatic ring with an electron-donating group contained in the acid labile group of general formula (2).

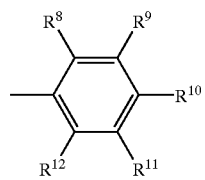
(3)

$R^8$, $R^{10}$ and $R^{12}$ each independently represents a hydrogen atom, an alkyl group with 1 to 4 carbons or an alkoxy group with 1 to 6 carbons, with at least one of these being such an alkyl group or alkoxy group. $R^9$ and $R^{11}$ each independently represents a hydrogen atom, an alkyl group with 1 to 4 carbons or an alkoxy group with 1 to 6 carbons. Still greater sensitivity is realized by introducing an electron-donating group at the ortho- or para-position.

Compound a3) is a compound in which an alkali-soluble group is protected by an acid labile group a, and this acid labile group a has an alkali-soluble group or alternatively acid labile group a has an alkali-soluble group protected by an acid labile group b. Acid labile group a and acid labile group b may have the same structure. Acid labile group a preferably either has at least one phenolic hydroxyl group or carboxyl group, or this phenolic hydroxyl group or carboxyl group is further protected by acid labile group b. The groups represented by general formula (4) may be given as examples of the structure of such an acid labile group a.

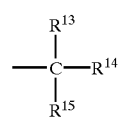
(4)

$R^{13}$ to $R^{15}$ are each independently an alkyl group, a substituted alkyl group, a cycloalkyl group, an aryl group, a substituted aryl group, a group containing an alkali-soluble group, or a group containing an alkali-soluble group protected by acid labile group b, with at least one being a group containing an alkali-soluble group, or a group containing an alkali-soluble group protected by acid labile group b. $R^{13}$ to $R^{15}$ may be the same or different. Here, at least one of $R^{13}$ to $R^{15}$ in general formula (4) is preferably a group represented by general formulae (5) or (6).

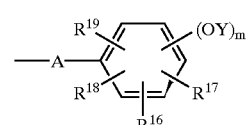
(5)

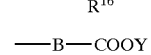
(6)

A represents an alkylene group with 1 to 4 carbons, an arylene group with 6 to 10 carbons or a single bond. B represents an alkylene group with 1 to 6 carbons, an arylene group with 6 to 10 carbons, an alkylenearylene group with 7 to 12 carbons or a single bond. $R^{16}$ to $R^{19}$ each independently represents a hydrogen atom or an alkyl group with 1 to 4 carbons. Y represents acid labile group b or a hydrogen atom, and m is 1 to 3. It is particularly preferred in terms of the sensitivity that at least one of $R^{13}$ to $R^{15}$ in general formula (4) be a group represented by general formulae (7) or (8).

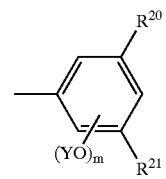
(7)

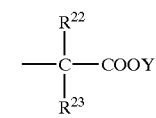
(8)

Here, $R^{20}$ and $R^{21}$ each independently represents a hydrogen atom or an alkyl group with 1 to 4 carbons. Y represents an acid labile group b or a hydrogen atom, and in is 1 to 3. Furthermore, $R^{22}$ and $R^{23}$ represent a hydrogen atom or an alkyl group with 1 to 4 carbons. Y represents an acid labile group b or a hydrogen atom. Examples of acid labile group b are the methoxymethyl group, inethyithiomethyl group, ethoxymethyl group, ethyithiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, methoxycarbonylmethyl group, ethoxycarbonylmethyl group, n-propoxycarbonylmethyl group, isopropoxycarbonylmethyl group, n-butoxycarbonylmethyl group, tert-butoxycarbonylmethyl group, propenyl group, 1-methoxyethyl group, 1-methylthioethyl group, 1,1-dimethoxyethyl group, 1-ethoxyethyl group, 1-ethylthioethyl group, 1,1-dimethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-isopropoxycarbonylethyl group, 1-n-butoxycarbonylethyl group, 1-tert-butoxycarbonylethyl group, isopropyl group, sec-butyl group, tert-butyl group, 1,1-dimethylbutyl group, trimethylsilyl group, ethyldimethylsilyl group, methyldiethylsilyl group, triethylsilyl group, isopropyldimethylsilyl group, methyldiisopropylsilyl group, triisopropylsilyl group, tert-butyldimethylsilyl group, methyldi-tert-butylsilyl group, tri-tert-butylsilyl group, phenyldimethylsilyl group, methyldiphenylsilyl group, triphenylsilyl group, methoxycarbonyl group, ethoxycarbonyl group, isopropoxycarbonyl group, tert-butoxycarbonyl group, acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propionyl group, methacryloyl group, crotonoyl group, oleoyl group, maleoyl group, fumaroyl group, mesaconoyl group, benzoyl group, phthaloyl group, isophthaloyl group, terephthaloyl group, naphthoyl group, toluoyl group, hydroatropoyl group, atropoyl group, cinnamoyl group, furoyl acid, thenoyl group, nicotinoyl group, isonicotinoyl group, p-toluenesulphonyl group, mesyl group, cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group and the like.

The compounds of conditions a1) to a3) are preferably polymers. The weight average molecular weight measured by GPC (gel permeation chromatography) based on polystyrene conversion will be 4,000–1,000,000, preferably 5,000–100,000, and more preferably 5,000–50,000. With a weight average molecular weight of less than 5,000, film formation becomes difficult, while with a weight average molecular weight of more than 50,000 the resist sensitivity is lowered.

Still further preferred as the compounds of a1) to a3) are polymers containing structural units represented by the following general formula (9). $R^{24}$ represents a hydrogen atom, an alkyl group with 1 to 4 carbons, a cyano group or a halogen. Z is a group represented by general formula (1), (2) or (4).

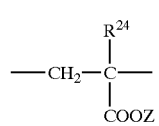

(9)

Furthermore, as the compounds of a2) or a3), polymers containing structural units represented by the following general formula (10) are preferred. $R^{25}$ represents a hydrogen atom, an alkyl group with 1 to 4 carbons, a cyano group or a halogen. X is an acid labile group represented by general formula (2) or (4).

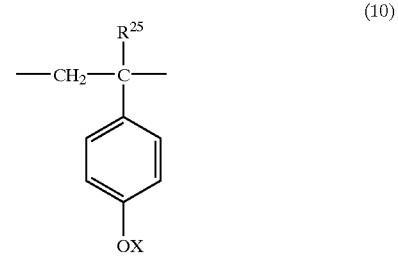

(10)

In order to obtain such polymer, there may be synthesized for example monomer with a structure in which the carboxyl group of acrylic acid or methacrylic acid is protected by an acid labile group represented by general formula (1), or monomer of structure in which the hydroxyl group of p-hydroxystyrene is protected by an acid labile group represented by general formula (2), and then polymerization carried out using azobisisobutyronitrile or the like.

Furthermore, in the structural units represented by general formula (9), it is more preferred that $R^{24}$ be a cyano group or halogen. When polymer with such a structure is exposed to radiation, the polymer chains are readily cleaved and the molecular weight lowered. As a result, the solubility of the exposed regions is raised and there is produced high sensitivity and high contrast.

Specific examples of the structural units represented by aforesaid general formulae (9) and (10) are as follows.

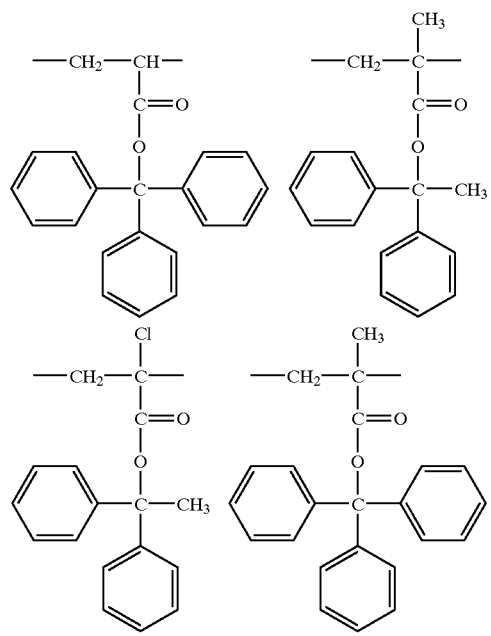

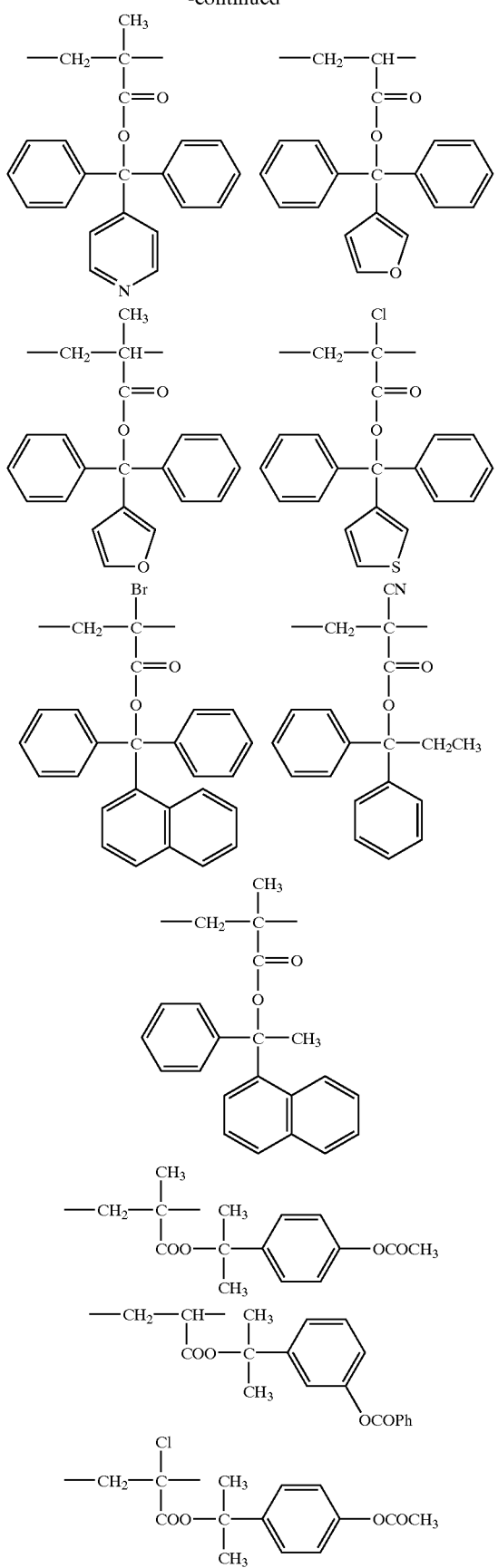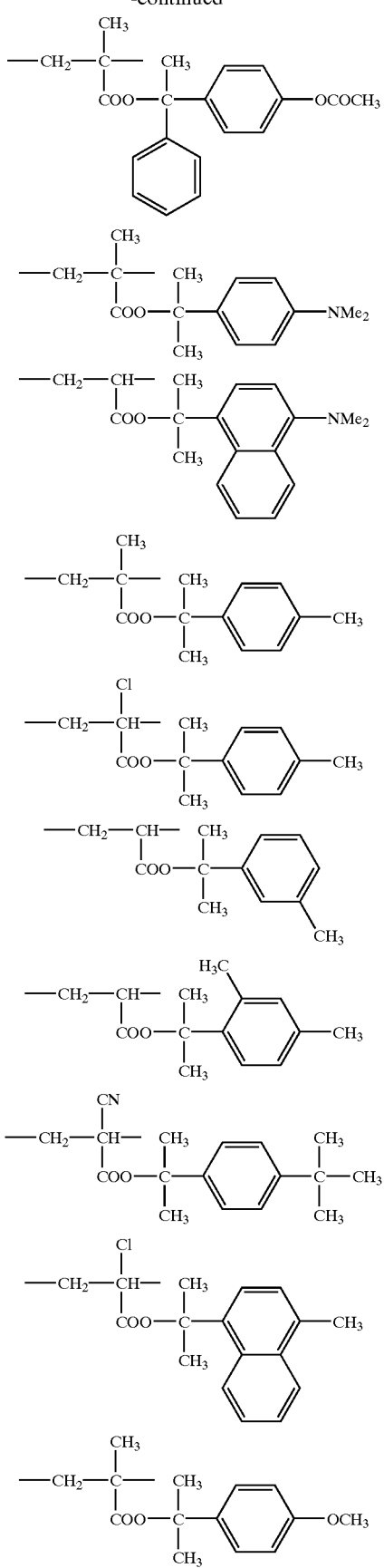

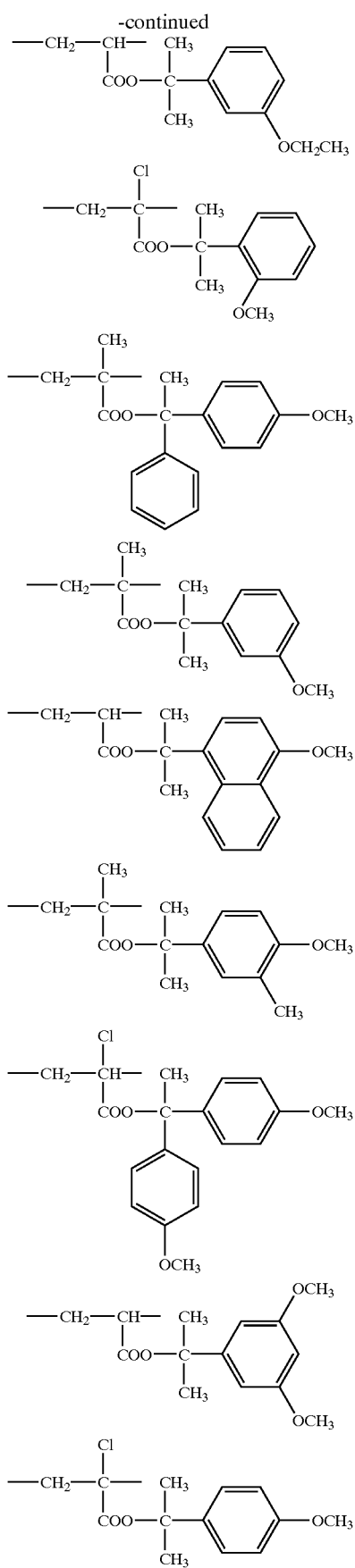
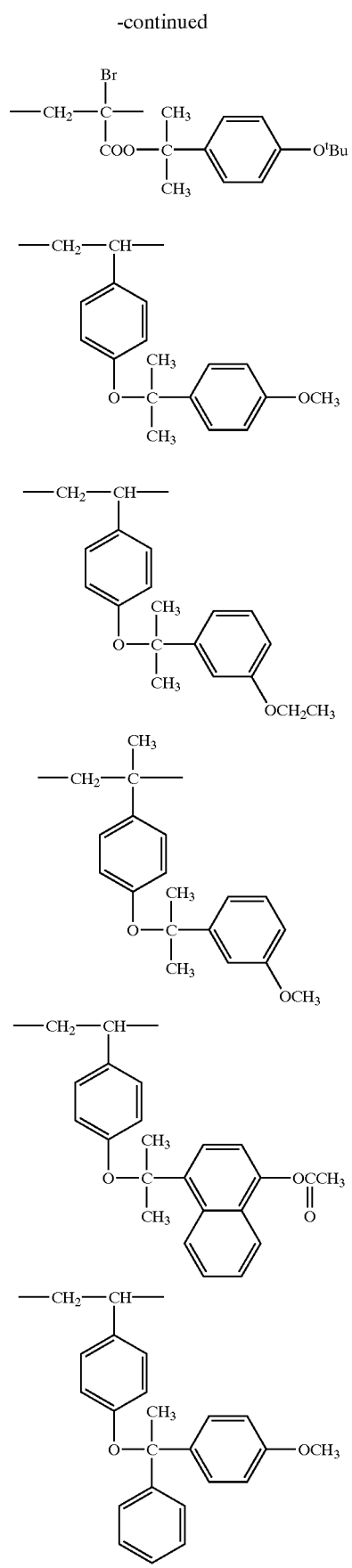

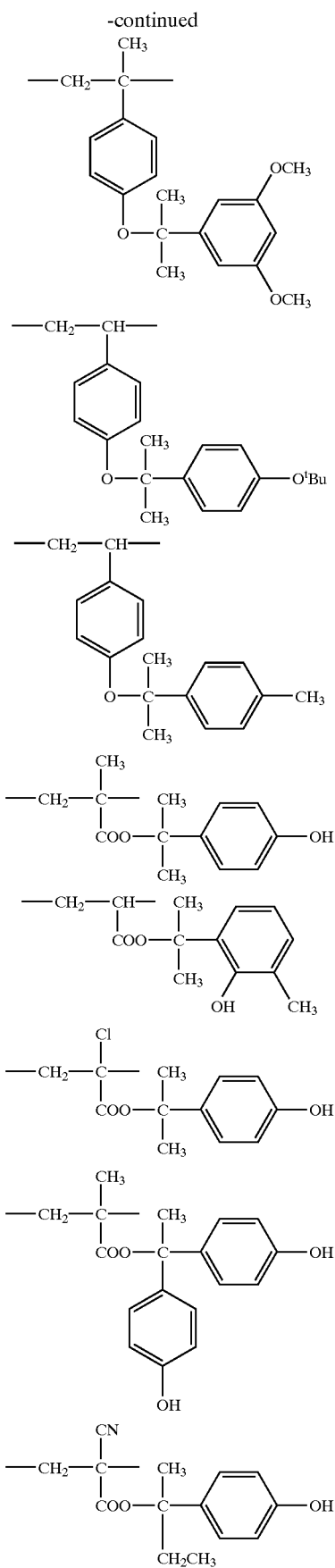
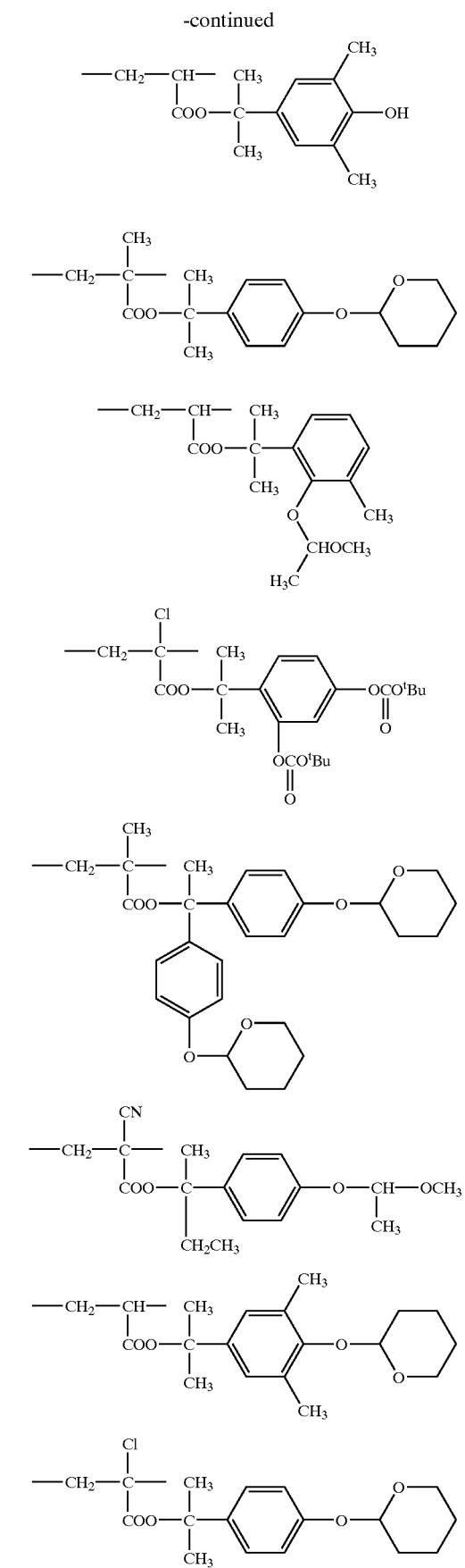

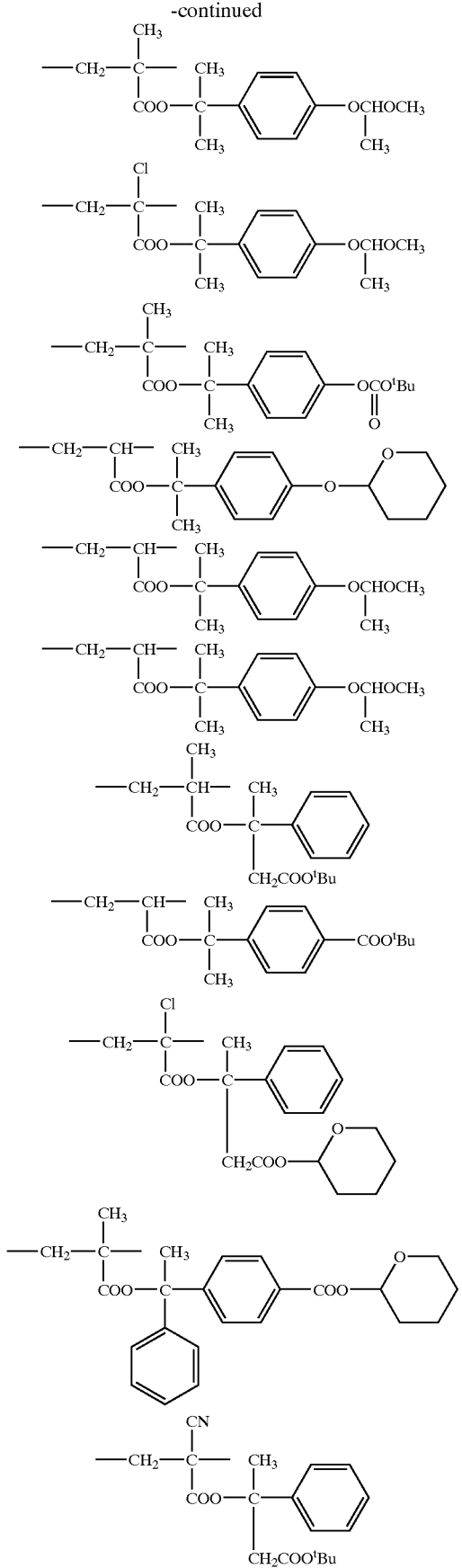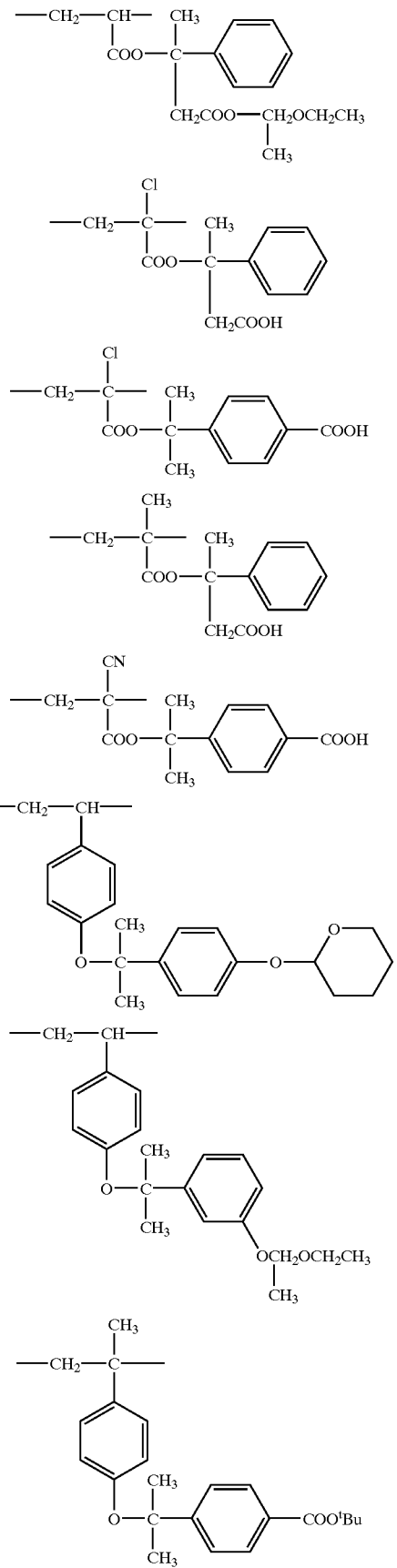

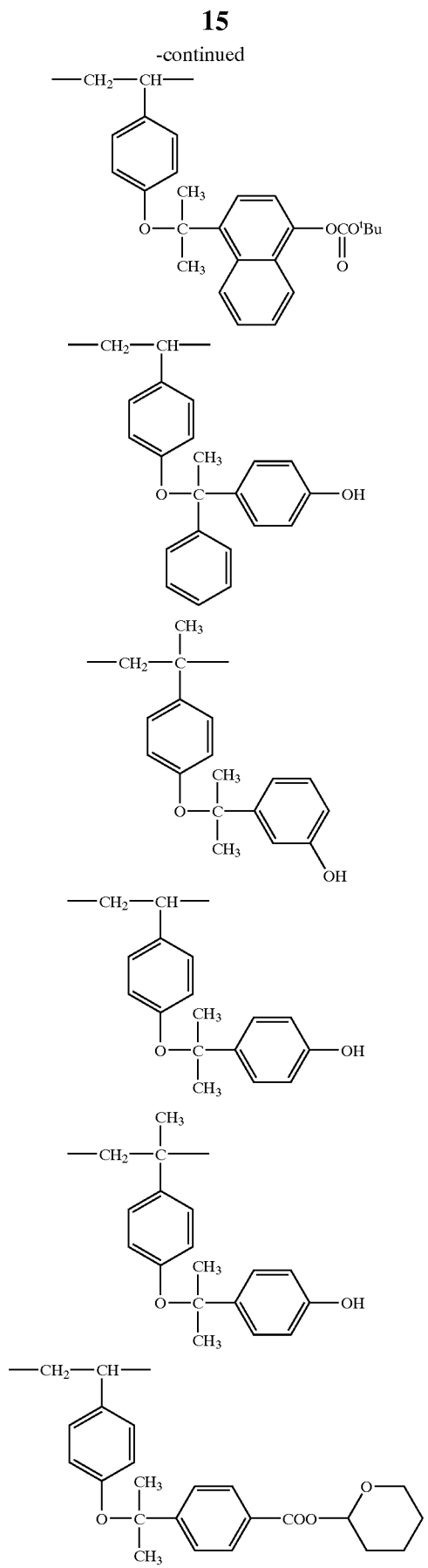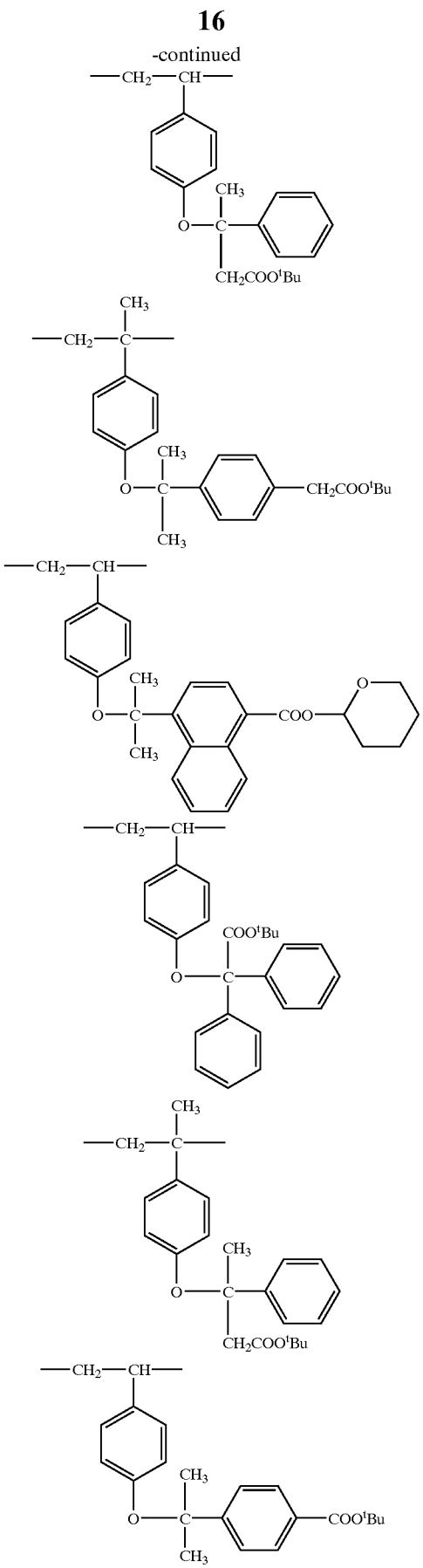

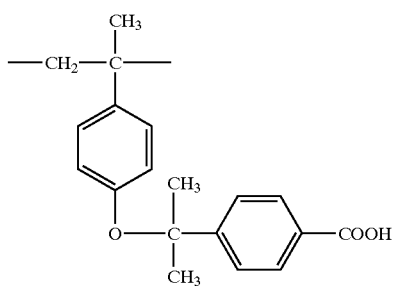

The polymer containing the structural units represented by general formula (9) or (10) may be a polymer containing only structural units represented by general formula (9) or (10), but it may also be a polymer containing other monomer units providing the characteristics as a chemically amplified resist are not impaired. Examples of other monomer structures are acrylic acid, methyl acrylate, ethyl acrylate, hydroxyethyl methacrylate, isopropyl acrylate, n-butyl acrylate, tert-butyl acrylate, methacrylic acid, methyl methacrylate, ethyl methacrylate, hydroxyethyl acrylate, isopropyl methacrylate, n-butyl methacrylate, tert-butyl methacrylate, methyl α-chloroacrylate, ethyl α-chloroacrylate, hydroxyethyl α-chloroacrylate, isopropyl α-chloroacrylate, n-butyl α-chloroacrylate, tert-butyl α-chloroacrylate, methyl α-cyanoacrylate, ethyl α-cyanoacrylate, hydroxyethyl α-cyanoacrylate, isopropyl α-cyanoacrylate, n-butyl α-cyanoacrylate, styrene, p-hydroxystyrene, α-methylstyrene, α-methyl-p-hydroxystyrene, maleic acid, maleic anhydride, crotonic acid, fumaric acid, mesaconic acid, citraconic acid, itaconic acid, itaconic anhydride, acrylonitrile, methacrylonitrile, crotonic nitrile, maleonitrile, fumaronitrile, metaconic nitrile, citraconic nitrile, itaconic nitrile, acrylamide, methacrylamide, crotonic amide, maleamide, fumaramide, mesaconic amide, citraconic amide, itaconic amide, vinylaniline, vinyl-pyrrolidone, vinylimidazole and the like. In the case where the other monomer units have an alkali-soluble group, this alkali-soluble group can be protected with an acid labile group. Specific examples of the acid labile group are those given as examples of acid labile group b.

Furthermore, the polymer containing structural units represented by aforesaid general formula (9) or (10) preferably used in the present invention may also contain the following cyclic structures in the main chain in order to enhance the dry etching resistance, etc.

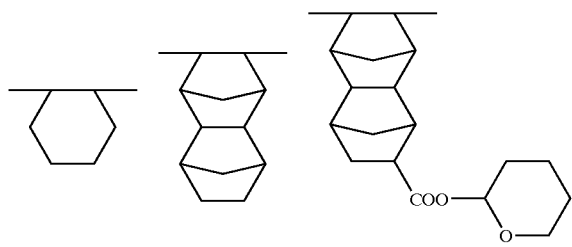

The positive-working radiation-sensitive composition of the present invention also contains b), an acid generator which generates acid by exposure to radiation. In this way, by making possible pattern formation based on the chemical amplification mechanism, it is possible to obtain a high resolution pattern at high sensitivity. The acid generator employed here may be of any kind providing that, as a result of the acid generated, the rate of dissolution of the compound of a1) to a3) in aqueous alkali solution is increased, and as examples thereof there are onium salts, halogen-containing compounds, diazoketone compounds, diazomethane compounds, sulphone compounds, sulphonic acid ester compounds, sulphonimide compounds and the like.

As specific examples of the onium salts, there are diazonium salts, ammonium salts, iodonium salts, sulphonium salts, phosphonium salts, oxonium salt and the like. Preferred examples of the onium salts are diphenyliodonium triflate, diphenyliodonium pinenesuphonate, diphenyliodonium dodecylbenzene-sulphonate, triphenylsulphonium triflate, triphenylsulphonium hexafluoroantimonate, triphenylsulphonium naphthalenesulphonate, (hydroxyphenyl) benzylmethylsulphonium toluenesulphonate and the like.

As specific examples of the halogen-containing compounds there are hydrocarbon compounds containing haloalkyl groups and heterocyclic compounds containing haloalkyl groups. Preferred halogen-containing compounds are 1,1-bis(4-chlorophenyl)-2,2,2-trichloroethane, 2-phenyl-4,6-bis(trichloromethyl)-s-triazine, 2-napthyl-4,6-bis(trichloromethyl)-s-triazine and the like.

Specific examples of the diazoketone compounds are 1,3-diketo-2-diazo compounds, diazobenzoquinone compounds, diazonaphthoquinone compounds and the like. As examples of preferred diazoketone compounds, there are the ester of 2,3,4,4'-tetrahydroxybenzophenone and 1,2-naphthoquinonediazide-4-Sulphonic acid, and the ester of 1,1,1-tris(4-hydroxyphenyl)ethane and 1,2-naphthoquinonediazide-4-sulphonic acid.

Specific examples of the diazomethane compounds are bis(trifluoromethylsulphonyl)diazomethane, bis (cyclohexylsulphonyl)diazomethane, bis(phenylsulphonyl) diazomethane, bis(p-tolylsulphonyl)diazomethane, bis(2,4-xylylsulphonyl)diazomethane, bis(p-chlorophenylsulphonyl)diazomethane, methylsulphonyl-p-toluenesulphonyldiazomethane, cyclohexylsulphonyl(1,1-dimethylethylsulphonyl)diazomethane, bis(1,1-dimethylethylsulphonyl)diazomethane, phenylsulphonyl (benzoyl)diazomethane and the like.

Specific examples of the sulphone compounds are β-ketosulphone compounds and β-sulphonylsulphone compounds. Preferred examples of such compounds are 4-trisphenacylsulphone, mesitylphenacylsulphone and bis (phenylsulphonyl)methane.

Examples of the sulphonic acid ester compounds are alkylsulphonates, haloalkylsulphonates, arylsulphonates, imino-sulphonates and the like. Specific examples of the sulphonic acid compounds are benzoin tosylate, pyrogallol trimesylate, nitrobenzyl-9,10-diethoxyanthracene-2-sulphonate and the like.

Specific examples of the sulphonimide compounds are N-(trifluoromethylsulphonyloxy)succinimide, N-(trifluoromethylsulphonyloxy)phthalimide, N-(trifluoromethylsulphonyloxy)diphenylmaleimide, N-(trifluoromethylsulphonyloxy)bicyclo[2.2.1]hept-5-ene-2,3-dicarboxylimide, N-(trifluoromethylsulphonyloxy)-7-oxabicyclo[2.2.1]hept-5-ene-2,3-dicarboxylimide, N-(camphorsulphonyloxy)bicyclo[2.2.1]heptane-5,6-oxy-2,3-dicarboxylimide, N-(trifluoromethylsulphonyloxy)naphthyldicarboxylimide, N-(camphorsulphonyloxy)succinimide, N-(camphorsulphonyloxy)phthalimide, N-(camphorsulphonyloxy)diphenylmaleimide, N-(camphorsulphonyloxy)bicyclo[2.2.1]hept-5-ene-2,3-dicarboxylimide, N-(camphorsulphonyloxy)-7-oxabicyclo[2.2.1]hept-5-ene-2,3-dicarboxylimide, N-(camphorsulphonyloxy)bicyclo[2.2.1]heptane-5,6-oxy-2,3-dicarboxylimide, N-(camphorsulphonyloxy)naphthyldicarboxylimide, N-(4-methylphenylsulphonyloxy)succinimide, N-(4-methylphenylsulphonyloxy)phthalimide, N-(4-methylphenylsulphonyloxy)diphenylmaleimide, N-(4-methylphenylsulphonyloxy)bicyclo[2.2.1]hept-5-ene-2,3-dicarboxylimide, N-(4-methylphenylsulphonyloxy)-7-oxabicyclo[2.2.1]hept-5-ene-2,3-dicarboxylimide, N-(4-methylphenylsulphonyloxy)bicyclo[2.2.1]heptan-5,6-oxy-2,3-dicarboxylimide, N-(4-methylphenylsulphonyloxy)naphthyldicarboxylimide, N-(2-trifluoromethylphenylsulphonyloxy)succinimide, N-(2-trifluoromethylphenylsulphonyloxy)phthalimide, N-(2-trifluoromethylphenylsulphonyloxy)diphenylmaleimide, N-(2-trifluoromethylphenylsulphonyloxy)bicycl[2.2.1]hept-5-ene -2,3-dicarboxylimide, N-(2-trifluoromethylphenylsulphonyloxy) -7-oxabicyclo[2.2.1]hept-5-ene-2,3-dicarboxylimide, N-(2-trifluoromethylphenylsulphonyloxy)bicyclo[2.2.1]heptane-5,6-oxy-2,3-dicarboxylimide, N-(2-trifluoromethylphenylsulphonyloxy)naphthyldicarboxylimide, N-(4-fluorophenylsulphonyloxy)succinimide, N-(2-fluorophenylsulphonyloxy)phthalimide, N-(4-fluorophenylsulphonyloxy)diphenylmaleimide, N-(4-fluorophenylsulphonyloxy)bicyclo[2.2.1]hept-5-ene-2,3-dicarboxylimide, N-(4-fluorophenylsulphonyloxy)-7-oxabicyclo[2.2.1]hept-5-ene-2, 3-dicarboxylimide, N-(4-fluorophenylsulphonyloxy)bicyclo[2.2.1]heptane-5,6-oxy-2,3-dicarboxylimide, N-(4-fluorophenylsulphonyloxy)naphthyldicarboxylimide and the like.

These acid generators can be used on their own or they can be used in the form of mixtures of two or more. The amount of the acid generator added is normally from 0.01 to 50 wt % in terms of the polymer, and more preferably 0.1 to 10 wt %. With less than 0.01 wt %, pattern formation becomes impossible, while with more than 50 wt % the affinity for the developer liquid is lowered and developing faults and the like arise.

The positive-working radiation-sensitive composition of the present invention may include alkali-soluble resin.

Where required, there may also be included in the positive-working radiation-sensitive composition of the present invention additives such as surfactants, sensitizers, stabilizers, antifoaming agents, acid diffusion inhibitors and the like.

The positive-working radiation-sensitive composition of the present invention is obtained by dissolving the aforesaid components in a solvent. The amount of solvent used is not particularly restricted but is adjusted such that the solids content is from 5 to 35 wt %. Examples of preferably-used solvents are solvents selected from esters such as ethyl acetate, butyl acetate, amyl acetate, ethyl propionate, methyl acetate, methyl benzoate, methyl lactate, ethyl lactate, ethyl pyruvate, methyl β-isobutyrate, methyl 3-methoxypropionate, ethyl 3-ethoxypropionate and γ-butyrolactone, Cellosolves such as Methyl Cellosolve, Ethyl Cellosolve and Butyl Cellosolve, Cellosolve esters such as Methyl Cellosolve Acetate, Ethyl Cellosolve Acetate and Butyl Cellosolve Acetate, propylene glycol esters such as propylene glycol monomethyl ether acetate and propylene glycol monoethyl ether acetate, ethers such as 1,2-dimethoxyethane, 1,2-diethoxyethane, tetrahydrofuran and anisole, ketones such as methyl ethyl ketone, methyl isobutyl ketone, methyl-n-amyl ketone, cyclohexanone and isophorone, and aprotic solvents such as dimethylformamide, dimethylacetamide, N-methylpyrrolidone, dimethylsulphoxide, sulfolane and the like, and combinations of such solvents.

The positive-working radiation-sensitive composition of the present invention is employed in the form of a thin film, normally in the range 0.2 μm to 2 μm, obtained by coating onto the substrate undergoing processing, and then drying. A fine pattern can be obtained by pattern-exposure of this thin film using radiation such as an electron beam, X-rays, vacuum ultraviolet or the like and then, following the exposure, carrying out baking and developing. In particular, the effects are still more marked in the case where an electron beam is used.

The developing of the positive-working radiation-sensitive composition of the present invention can be carried out using known developing liquids. As examples, there are aqueous solutions containing an alkali metal hydroxide, carbonate, phosphate, silicate, borate or other such inorganic alkali, 2-diethylaminoethanol, monoethanolamine, diethanolamine or other such amine, or tetramethylammonium hydroxide, choline or other such quaternary ammonium compound, or containing a combination of these.

EXAMPLES

Below, the present invention is explained in more specific terms by providing examples but the invention is not to be restricted to these examples. Now, the weight average molecular weight in these examples is the GPC (gel permeation chromatography) measurement value based on polystyrene conversion. In the GPC measurements, there were used three connected GPC columns, "KF-804", "KF-803" and "KF-802", made by Showa Denko K.K., and tetrahydrofuran was employed as the mobile phase, at a flow-rate of 0.8 ml per minute. The sample concentration was 0.2 wt % and the amount of injected sample was 0.1 ml. The detector was a differential refractometer.

Example 1

A 60:40 (molar ratio) mixture of 1,1-diphenylethyl methacrylate and p-hydroxy-α-methylstyrene was polymerized at 70° C. in 1,4-dioxane using azobisisobutyronitrile as the initiator, and a polymer of the following chemical formula (11) obtained (weight average molecular weight 8200). 3 g of this polymer and 300 mg of triphenylsulphonium triflate were dissolved in Methyl Cellosolve Acetate and, by filtering with a 0.2 μm filter, there was obtained a resist composition.

The resist composition obtained was spin-coated onto a silicon wafer which had been HMDS treated, after which heating was carried out for 2 minutes at 100° C. and a resist film of film thickness 0.5 μm obtained. Using an electron beam exposure device, this resist film was subjected to electron beam irradiation in the form of a pattern at an accelerating voltage of 20 kV. After heating for 2 minutes at 90° C., development was carried out for 1 minute with 2.38% tetramethylammonium hydroxide solution (ELM-D, produced by the Mitsubishi Gas Chemical Co.). At an exposure of 2.7 μC/cm², there was obtained a 0.20 μm pattern.

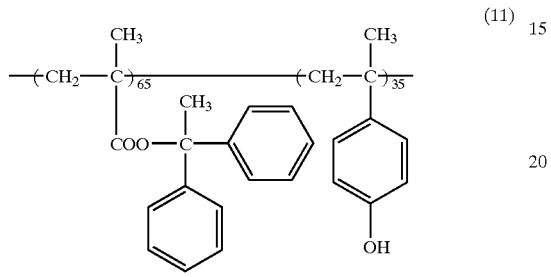

(11)

Example 2

A resist film was obtained in the same way as in Example 1 except that there was used polymer (weight average molecular weight 24000) of the following chemical formula (12) instead of the copolymer employed in Example 1, and then election beam irradiation and development were carried out. At an exposure of 3.9 μC/cm², there was obtained a 0.23 μm pattern.

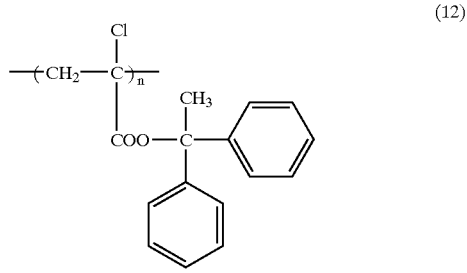

(12)

Example 3

A resist film was obtained in the same way as in Example 1 except that there was used polymer (weight average molecular weight 10000) of the following chemical formula (13) instead of the copolymer employed in Example 1, and then electron beam irradiation and development were carried out. At an exposure of 4.1 μC/cm², there was obtained a 0.23 μm pattern.

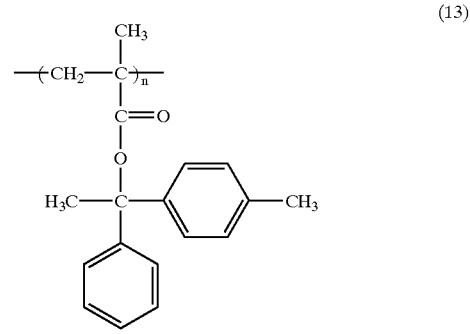

(13)

Example 4

A resist film was obtained in the same way as in Example 1 except that there was used copolymer (weight average molecular weight 9000) of the following chemical formula (14) instead of the copolymer employed in Example 1, and then electron beam irradiation and development were carried out. At an exposure of 2.9 μC/cm², there was obtained a 0.22 μm pattern.

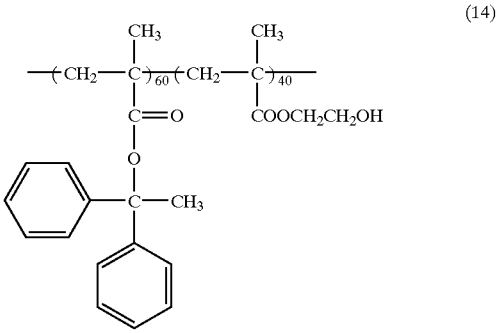

(14)

Example 5

A resist film was obtained in the same way as in Example 1 except that there was used copolymer (weight average molecular weight 7900) of the following chemical formula (15) instead of the copolymer employed in Example 1, and then electron beam irradiation and development were carried out. At an exposure of 2.4 μC/cm², there was obtained a 0.19 μm pattern.

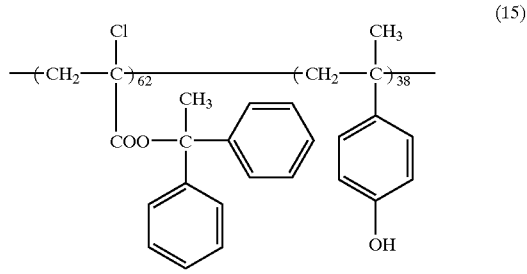

(15)

Example 6

Testing was carried out in the same way as in Example 4, except that there was used an 1-line stepper as the exposure device. At an exposure of 49 μJ/cm², there was obtained a 2.6 μm pattern.

Example 7

A resist film was obtained in the same way as in Example 1 except that there was used copolymer (weight average molecular weight 10000) of the following chemical formula (16) instead of the copolymer employed in Example 1, and then electron beam irradiation and development were carried out. At an exposure of 1.6 $\mu C/cm^2$, there was obtained a 0.20 $\mu m$ pattern.

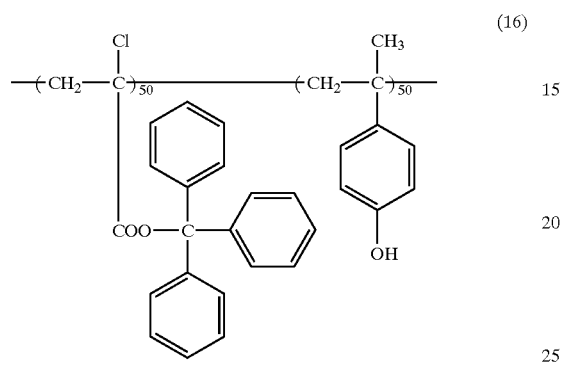

(16)

Example 8

A resist film was obtained in the same way as in Example 1 except that there was used copolymer (weight average molecular weight 13000) of the following chemical formula (17) instead of the copolymer employed in Example 1, and then electron beam irradiation and development were carried out. At an exposure of 2.7 $\mu C/cm^2$, there was obtained a 0.23 $\mu m$ pattern.

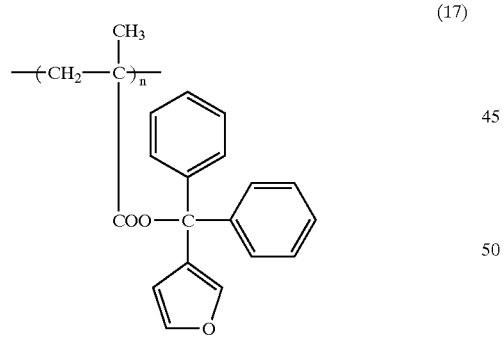

(17)

Example 9

A resist film was obtained in the same way as in Example 1 except that there was used polymer (weight average molecular weight 13000) of the following chemical formula (17) instead of the copolymer employed in Example 1, and then electron beam irradiation and development were carried out. At an exposure of 2.7 $\mu C/cm^2$, there was obtained a 0.23 $\mu m$ pattern.

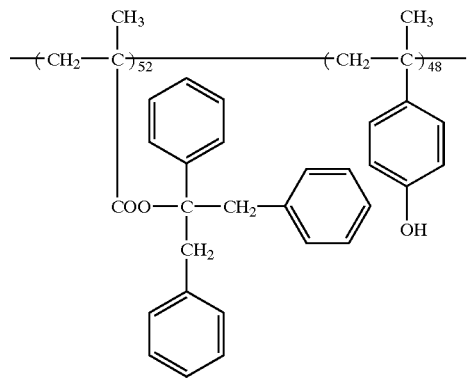

(18)

Example 10

A resist film was obtained in the same way as in Example 1 except that there was used copolymer (weight average molecular weight 26000) of the following chemical formula (19) instead of the copolymer employed in Example 1, and then electron beam irradiation and development were carried out. At an exposure of 2.0 $\mu C/cm^2$, there was obtained a 0.21 $\mu m$ pattern.

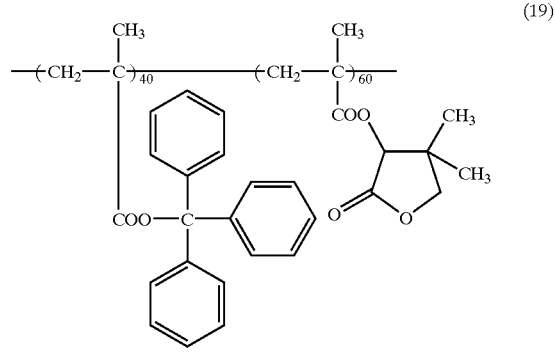

(19)

Example 11

A resist film was obtained in the same way as in Example 1 except that there was used copolymer (weight average molecular weight 58000) of the following chemical formula (20) instead of the copolymer employed in Example 1, and then electron beam irradiation and development were carried out. At an exposure of 3.6 $\mu C/cm^2$, there was obtained a 0.22 $\mu m$ pattern.

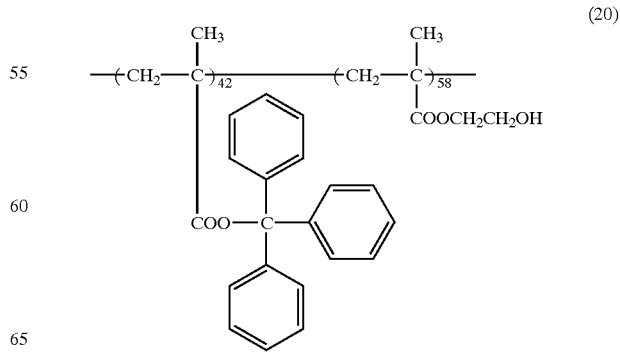

(20)

Example 12

Testing was carried out in the same way as in Example 10 except that there was used an 1-line stepper as the exposure device. At an exposure of 34 mJ/cm², there was obtained a 0.35 μm pattern.

Example 13

A resist film was obtained in the same way as in Example 1 except that there was used copolymer (weight average molecular weight 9700) of the following chemical formula (21) instead of the copolymer employed in Example 1, and then electron beam irradiation and development were carried out. At an exposure of 1.6 μC/cm², there was obtained a 0.19 μm pattern.

(21)

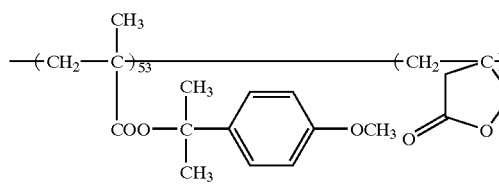

Example 14

A resist film was obtained in the same way as in Example 1 except that there was used copolymer (weight average molecular weight 19000) of the following chemical formula (22) instead of the copolymer employed in Example 1, and then electron beam irradiation and development were carried out. At an exposure of 1.9 μC/cm², there was obtained a 0.20 μm pattern.

(22)

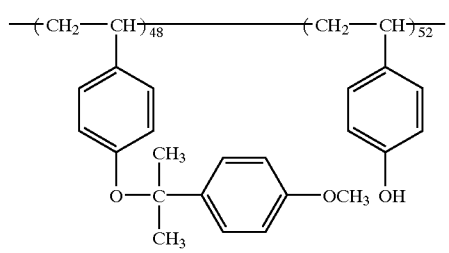

Example 15

A resist film was obtained in the same way as in Example 1 except that there was used copolymer (weight average molecular weight 11000) of the following chemical formula (23) instead of the copolymer employed in Example 1, and then electron beam irradiation and development were carried out. At an exposure of 1.4 μC/cm², there was obtained a 0.20 μm pattern.

(23)

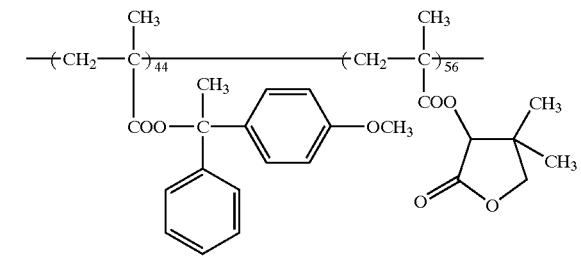

Example 16

A resist film was obtained in the same way as in Example 1 except that there was used copolymer (weight average molecular weight 9500) of the following chemical formula (24) instead of the copolymer employed in Example 1, and then electron beam irradiation and development were carried out. At an exposure of 1.2 μC/cm², there was obtained a 0.19 μm pattern.

(24)

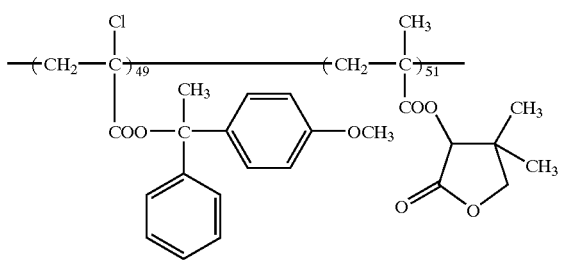

Example 17

A resist film was obtained in the same way as in Example 1 except that there was used copolymer (weight average molecular weight 4500) of the following chemical formula (25) instead of the copolymer employed in Example 1, and then electron beam irradiation and development were carried out. At an exposure of 3.0 μC/cm², there was obtained a 0.24 μm pattern.

(25)

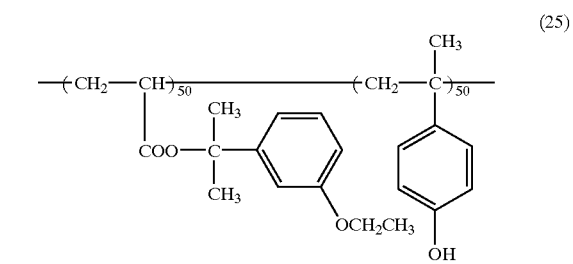

Example 18

A resist film was obtained in the same way as in Example 1 except that there was used copolymer (weight average molecular weight 56000) of the following chemical formula (26) instead of the copolymer employed in Example 1, and then electron beam irradiation and development were carried out. At an exposure of 3.5 μC/cm², there was obtained a 0.23 μm pattern.

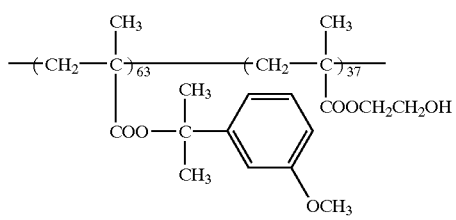
(26)

Example 19

A resist film was obtained in the same way as in Example 1 except that there was used copolymer (weight average molecular weight 18000) of the following chemical formula (27) instead of the copolymer employed in Example 1, and then electron beam irradiation and development were carried out. At an exposure of 2.4 $\mu C/cm^2$, there was obtained a 0.21 $\mu m$ pattern.

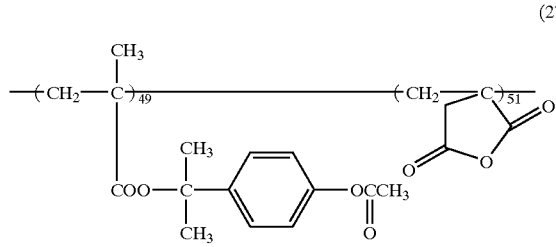
(27)

Example 20

A resist film was obtained in the same way as in Example 1 except that there was used copolymer (weight average molecular weight 25000) of the following chemical formula (28) instead of the copolymer employed in Example 1, and then electron beam irradiation and development were carried out. At an exposure of 1.7 $\mu C/cm^2$, there was obtained a. 0.20 $\mu m$ pattern.

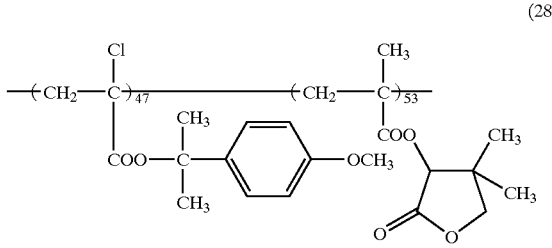
(28)

Example 21

Testing was carried out in the same way as in Example 13 except that there was used an i-line stepper as the exposure device. At an exposure of 29 $mJ/cm^2$, there was obtained a 0.31 $\mu m$ pattern.

Example 22

A resist film was obtained in the same way as in Example 1 except that there was used copolymer (weight average molecular weight 23000) of the following chemical formula (29) instead of the copolymer employed in Example 1, and then electron beam irradiation and development were carried out. At an exposure of 2.0 $\mu C/cm^2$, there was obtained a 0.19 $\mu m$ pattern.

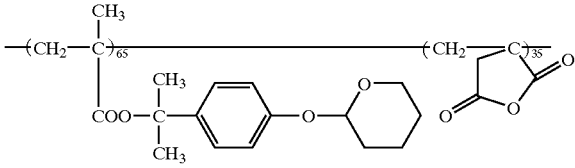
(29)

Example 23

A resist film was obtained in the same way as in Example 1 except that there was used copolymer (weight average molecular weight 18000) of the following chemical formula (30) instead of the copolymer employed in Example 1, and then electron beam irradiation and development were carried out. At an exposure of 2.7 $\mu C/cm^2$, there was obtained a 0.22 $\mu m$ pattern.

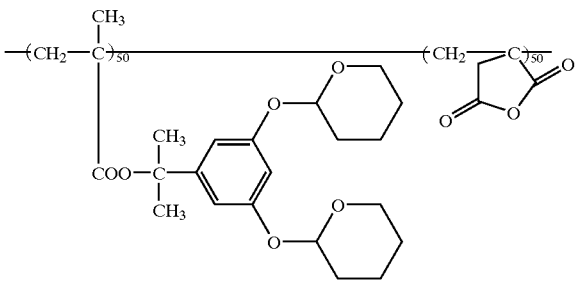
(30)

Example 24

A resist film was obtained in the same way as in Example 1 except that there was used copolymer (weight average molecular weight 57000) of the following chemical formula (31) instead of the copolymer employed in Example 1, and then electron beam irradiation and development were carried out. At an exposure of 3.7 $\mu C/cm^2$, there was obtained a 0.22 $\mu m$ pattern.

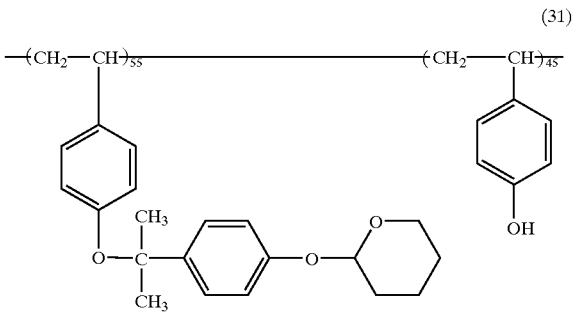
(31)

Example 25

A resist film was obtained in the same way as in Example 1 except that there was used copolymer (weight average molecular weight 35000) of the following chemical formula (32) instead of the copolymer employed in Example 1, and then electron beam irradiation and development were carried out. At an exposure of 2.5 $\mu C/cm^2$, there was obtained a 0.21 $\mu m$ pattern.

(32)

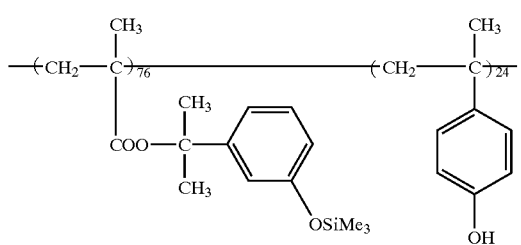

Example 26

A resist film was obtained in the same way as in Example 1 except that there was used copolymer (weight average molecular weight 4500) of the following chemical formula (33) instead of the copolymer employed in Example 1, and then electron beam irradiation and development were carried out. At an exposure of 3.2 $\mu C/cm^2$ there was obtained a 0.23 $\mu m$ pattern.

(33)

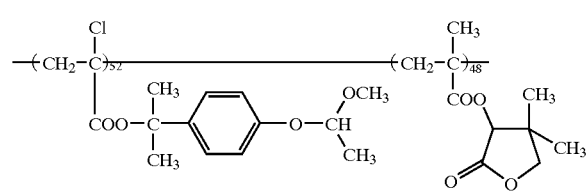

Example 27

A resist film was obtained in the same way as in Example 1 except that there was used copolymer (weight average molecular weight 18000) of the following chemical formula (34) instead of the copolymer employed in Example 1, and then electron beam irradiation and development were carried out. At an exposure of 1.6 $\mu C/cm^2$, there was obtained a 0.20 $\mu m$ pattern.

(34)

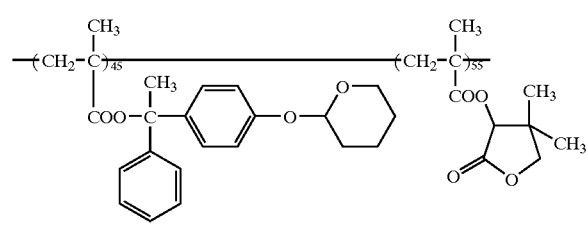

Example 28

Testing was carried out in the same way as in Example 22 except that there was used an 1-line stepper as the exposure device. At an exposure of 36 $mJ/cm^2$, there was obtained a 0.33 $\mu m$ pattern.

Example 29

A resist film was obtained in the same way as in Example 1 except that there was used copolymer (weight average molecular weight 21000) of the following chemical formula (35) instead of the copolymer employed in Example 1, and then electron beam irradiation and development were carried out. At an exposure of 1.7 $\mu C/cm^2$, there was obtained a 0.19 $\mu m$ pattern.

(35)

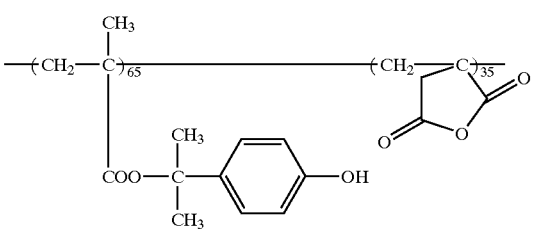

Example 30

A resist film was obtained in the same way as in Example 1 except that there was used copolymer (weight average molecular weight 31000) of the following chemical formula (36) instead of the copolymer employed in Example 1, and then electron beam irradiation and development were carried out. At an exposure of 2.4 $\mu C/cm^2$, there was obtained a 0.22 $\mu m$ pattern.

(36)

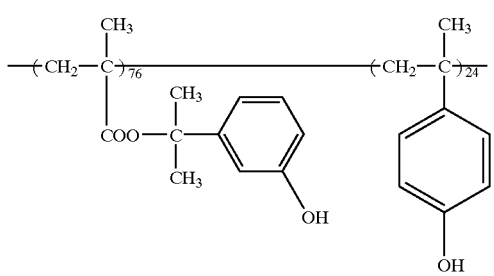

Example 31

A resist film was obtained in the same way as in Example 1 except that there was used copolymer (weight average molecular weight 19000) of the following chemical formula (37) instead of the copolymer employed in Example 1, and then electron beam irradiation and development were carried out. At an exposure of 1.6 $\mu C/cm^2$, there was obtained a 0.20 $\mu m$ pattern.

(37)

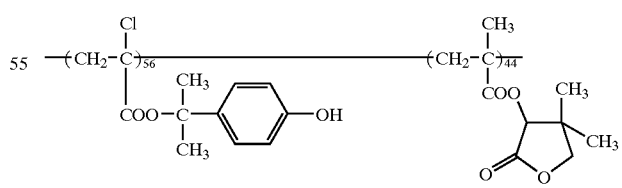

Example 32

A resist film was obtained in the same way as in Example 1 except that there was used polymer (weight average molecular weight 8000) of the following chemical formula (38) instead of the copolymer employed in Example 1, and then electron beam irradiation and development were carried out. At an exposure of 3.5 $\mu C/cm^2$, there was obtained a 0.24 $\mu m$ pattern.

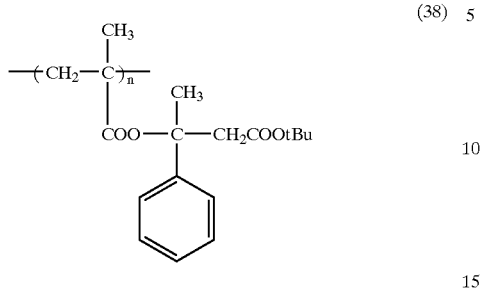

(38)

Example 33

A resist film was obtained in the same way as in Example 1 except that there was used copolymer (weight average molecular weight 11000) of the following chemical formula (39) instead of the copolymer employed in Example 1, and then electron beam irradiation and development were carried out. At an exposure of 3.3 $\mu C/cm^2$, there was obtained a 0.22 $\mu m$ pattern.

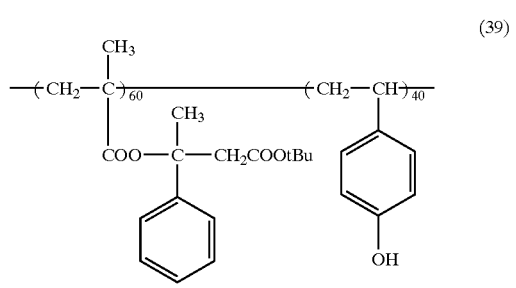

(39)

Example 34

A resist film was obtained in the same way as in Example 1 except that there was used copolymer (weight average molecular weight 9000) of the following chemical formula (40) instead of the copolymer employed in Example 1, and then electron beam irradiation and development were carried out. At an exposure of 3.2 $\mu C/cm^2$, there was obtained a 0.22 $\mu m$ pattern.

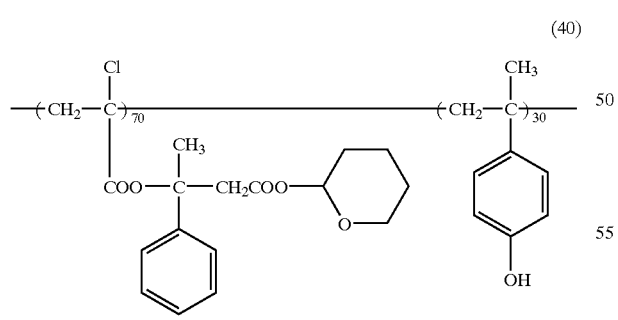

(40)

Example 35

A resist film was obtained in the same way as in Example 1 except that there was used copolymer (weight average molecular weight 14000) of the following chemical formula (41) instead of the copolymer employed in Example 1, and then electron beam irradiation and development were carried out.

At an exposure of 3.9 $\mu C/cm^2$, there was obtained a 0.23 $\mu m$ pattern.

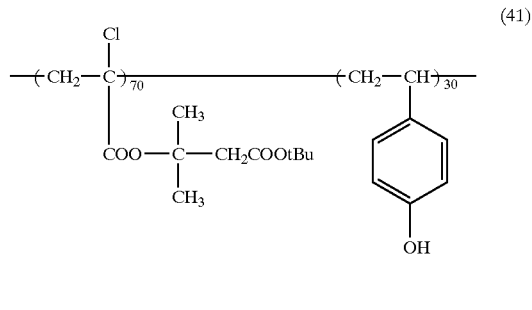

(41)

Example 36

Testing was carried out in the same way as in Example 34 except that there was used and i-line stepper as the exposure device. At an exposure of 36 $mJ/cm^2$, there was obtained a 0.33 $\mu m$ pattern.

Comparative Example 1

A resist film was obtained in the same way as in Example 1 except that there was used poly(tert-butyl α-chloroacrylate) (weight average molecular weight 21000) instead of the copolymer employed in Example 1, and then electron beam irradiation and development were carried out. At an exposure of 6.2 $\mu C/cm^2$, there was obtained a 0.33 $\mu m$ pattern, and in terms of sensitivity and resolution the properties were inadequate.

Comparative Example 2

A resist film was obtained in the same way as in Example 1 except that there was used copolymer (weight average molecular weight 12000) of the following chemical formula (42) instead of the copolymer employed in Example 1, and then evaluation carried out.

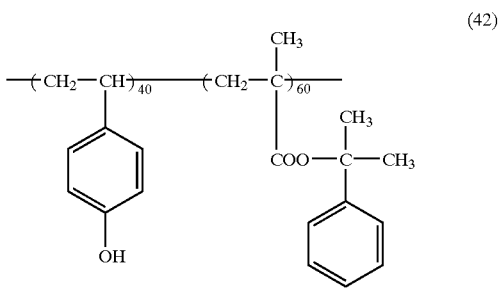

(42)

At an exposure of 5.8 $\mu C/cm^2$, there was obtained a 0.25 $\mu m$ pattern, and in terms of sensitivity and resolution the properties were inadequate.

The results are shown in Tables 1 and 2.

Industrial Application Potential

As described above, in the positive-working radiation-sensitive composition of the present invention a compound containing a specified acid labile group and an acid generator which generates acid as a result of irradiation with radiation are employed, so that it is possible to obtained a composition of high resolution and high sensitivity.

TABLE 1

Examples

| Example | Polymer |
|---|---|
| 1 | Copolymer: -(CH$_2$-C(CH$_3$)(COO-C(CH$_3$)(C$_6$H$_5$)$_2$))$_{65}$-(CH$_2$-C(CH$_3$)(4-C$_6$H$_4$OH))$_{35}$- |
| 2 | -(CH$_2$-C(Cl)(COO-C(CH$_3$)(C$_6$H$_5$)$_2$))$_{32}$- |
| 3 | -(CH$_2$-C(CH$_3$)(COO-C(CH$_3$)(C$_6$H$_5$)(4-CH$_3$-C$_6$H$_4$)))$_n$- |
| 4 | -(CH$_2$-C(CH$_3$)(COO-C(CH$_3$)(C$_6$H$_5$)$_2$))$_{60}$-(CH$_2$-C(CH$_3$)(COOCH$_2$CH$_2$OH))$_{40}$- |
| 5 | -(CH$_2$-C(Cl)(COO-C(CH$_3$)(C$_6$H$_5$)$_2$))$_{62}$-(CH$_2$-C(CH$_3$)(4-C$_6$H$_4$OH))$_{39}$- |

TABLE 1-continued
| | |
|---|---|
| 6 | Same as Example 4 |
| 7 | 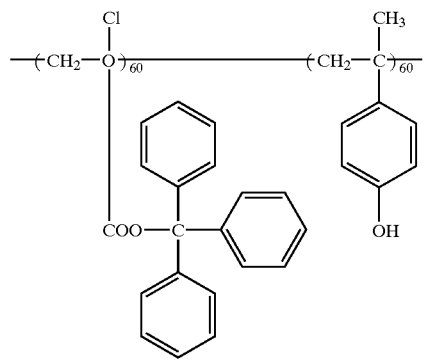 |
| 8 | 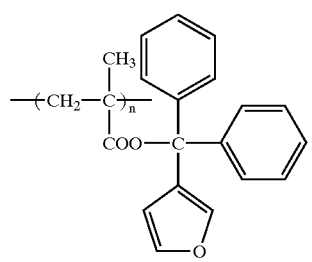 |
| 9 | 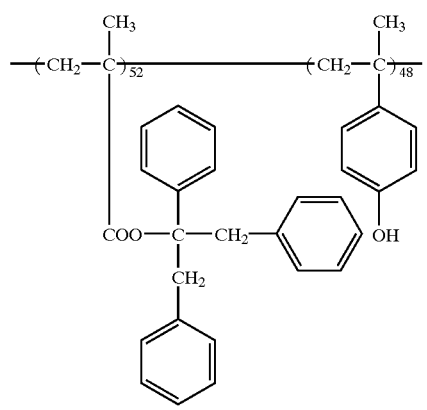 |
| 10 | 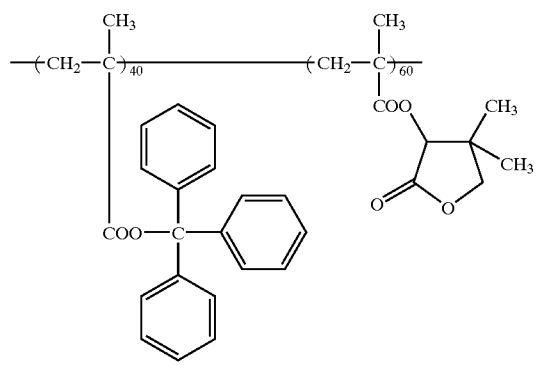 |

TABLE 1-continued
11 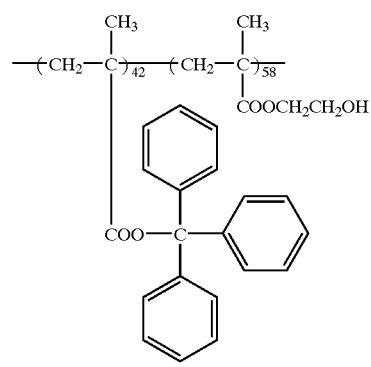
12  Same as Example 10
13 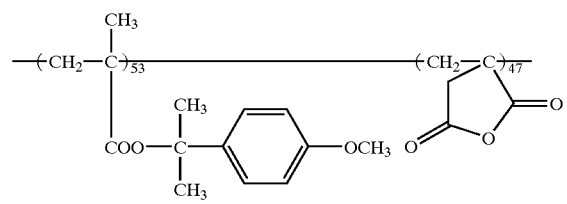
14 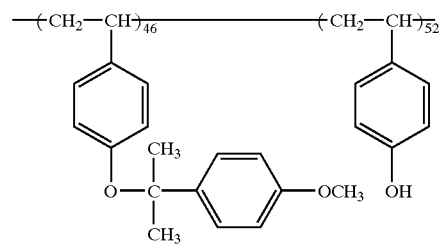
15 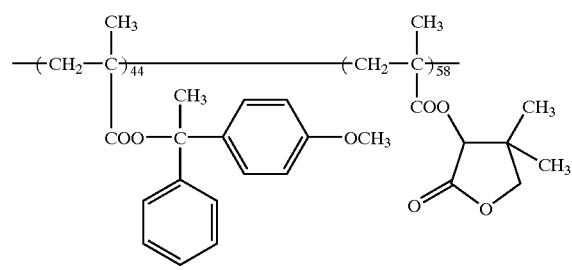
16 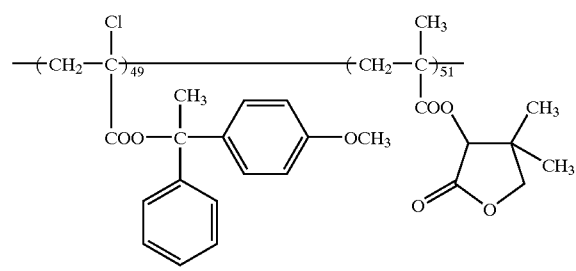

TABLE 1-continued
17 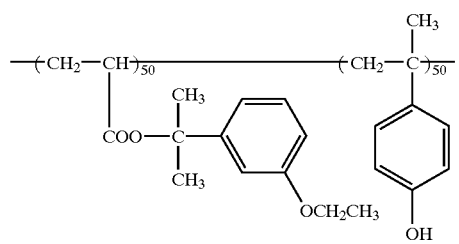
18 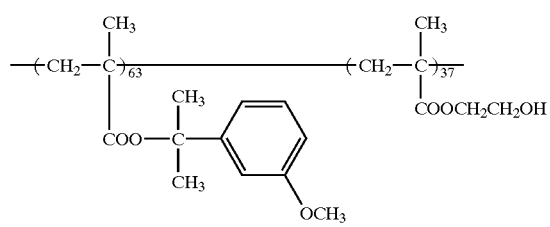
19 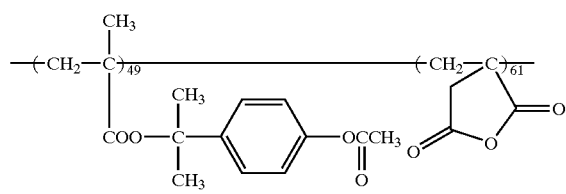
20 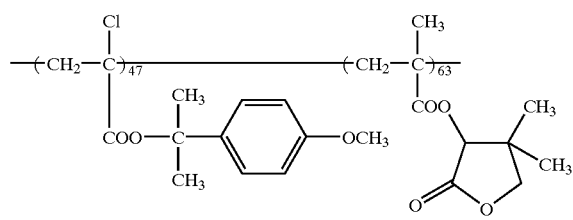
21 Same as Example 13
22 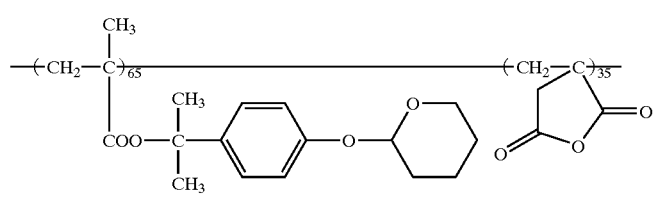
23 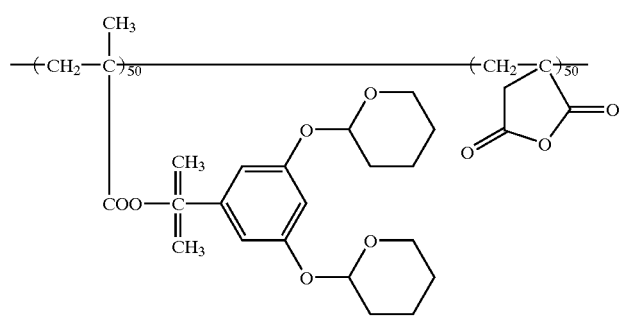

TABLE 1-continued

| 24 | Structure: copolymer with units $-(CH_2-CH)_{55}-$ bearing a phenyl group with O-C(CH$_3$)$_2$- linked to phenyl-O-tetrahydropyranyl, and $-(CH_2-CH)_{45}-$ bearing a phenyl-OH group |
|---|---|
| 25 | Structure: copolymer with units $-(CH_2-C(CH_3))_{76}-$ bearing COO-C(CH$_3$)$_2$-(m-phenyl)-OSiMe$_3$, and $-(CH_2-C(CH_3))_{24}-$ bearing phenyl-OH |
| 26 | Structure: copolymer with units $-(CH_2-CCl)_{52}-$ bearing COO-C(CH$_3$)$_2$-(p-phenyl)-O-CH(OCH$_3$)(CH$_3$), and $-(CH_2-C(CH_3))_{48}-$ bearing COO-linked dimethyl-γ-butyrolactone |
| 27 | Structure: copolymer with units $-(CH_2-C(CH_3))_{45}-$ bearing COO-C(CH$_3$)(phenyl)-(p-phenyl)-O-tetrahydropyranyl, and $-(CH_2-C(CH_3))_{85}-$ bearing COO-linked dimethyl-γ-butyrolactone |
| 28 | Same as Example 22 |
| 29 | Structure: copolymer with units $-(CH_2-C(CH_3))_{55}-$ bearing COO-C(CH$_3$)$_2$-(p-phenyl)-CH, and $-(CH_2-C)_{36}-$ fused to succinic anhydride ring |
| 30 | Structure: copolymer with units $-(CH_2-C(CH_3))_{76}-$ bearing COO-C(CH$_3$)$_2$-(m-phenyl)-OH, and $-(CH_2-C(CH_3))_{24}-$ bearing p-phenyl-OH |

TABLE 1-continued
31 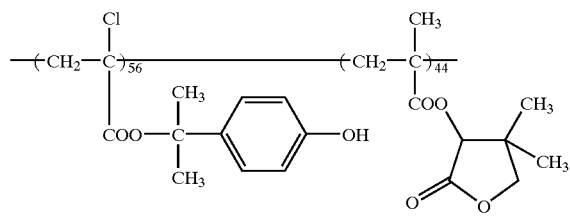
32 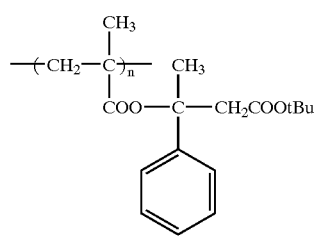
33 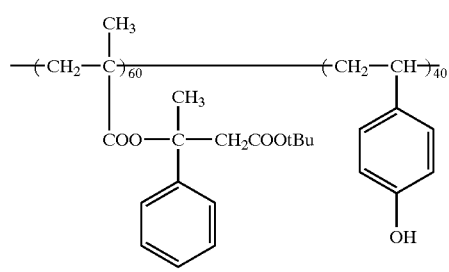
34 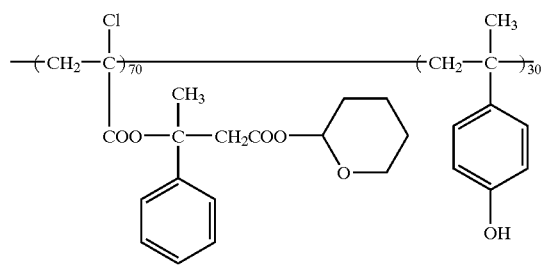
35 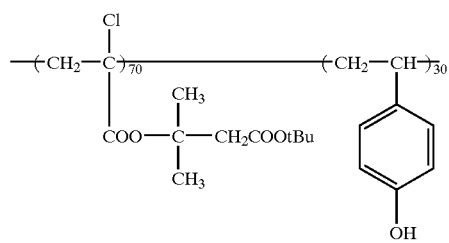
36  Same as Example 34
| Example | Mw | Sensitivity ($\mu C/cm^2$) | Resolution ($\mu m$) |
|---|---|---|---|
| 1 | 8200 | 2.7 | 0.20 |
| 2 | 24000 | 3.9 | 0.23 |
| 3 | 10000 | 4.1 | 0.23 |
| 4 | 9000 | 2.9 | 0.22 |
| 5 | 7900 | 2.4 | 0.19 |
| 6 | Same as Example 4 | 49 $mJ/cm^2$ (i-line) | 2.6 |
| 7 | 10000 | 1.6 | 0.20 |
| 8 | 13000 | 2.7 | 0.23 |
| 9 | 4400 | 3.0 | 0.23 |
| 10 | 26000 | 2.0 | 0.21 |
| 11 | 58000 | 3.6 | 0.22 |
| 12 | Same as Example 10 | 34 $mJ/cm^2$ (i-line) | 0.35 |
| 13 | 9700 | 1.6 | 0.19 |

TABLE 1-continued

| | | | |
|---|---|---|---|
| 14 | 19000 | 1.9 | 0.20 |
| 15 | 11000 | 1.4 | 0.20 |
| 16 | 9500 | 1.2 | 0.19 |
| 17 | 4500 | 3.0 | 0.24 |
| 18 | 56000 | 3.5 | 0.23 |
| 19 | 18000 | 2.4 | 0.21 |
| 20 | 25000 | 1.7 | 0.20 |
| 21 | Same as in Example 13 | 29 mJ/cm$^2$ (i-line) | 0.31 |
| 22 | 23000 | 2.0 | 0.19 |
| 23 | 18000 | 2.7 | 0.22 |
| 24 | 57000 | 3.7 | 0.22 |
| 25 | 35000 | 2.5 | 0.21 |
| 26 | 4500 | 3.2 | 0.23 |
| 27 | 18000 | 1.6 | 0.20 |
| 28 | Same as Example 22 | 36 mJ/cm$^2$ (i-line) | 0.33 |
| 29 | 21000 | 1.7 | 0.19 |
| 30 | 31000 | 2.4 | 0.22 |
| 31 | 19000 | 1.6 | 0.20 |
| 32 | 8000 | 3.5 | 0.24 |
| 33 | 11000 | 3.3 | 0.22 |
| 34 | 9000 | 3.2 | 0.22 |
| 35 | 14000 | 3.9 | 0.23 |
| 36 | Same as Example 34 | 36 mJ/cm$^2$ | 0.33 |

TABLE 2

Comparative Examples

| Comp. Ex. | Polymer | Mw | Sensitivity ($\mu$C/cm$^2$) | Resolution ($\mu$m) |
|---|---|---|---|---|
| 1 | ![structure 1] | 21000 | 6.2 | 0.33 |
| 2 | ![structure 2] | 12000 | 5.8 | 0.25 |

What is claimed is:

1. A positive-working radiation-sensitive composition comprising a) a compound with an alkali-soluble group protected by an acid labile group a and b) an acid generator which generates acid by irradiation with radiation, wherein the acid labile group a has an alkali-soluble group or alternatively the acid labile group a has an alkali-soluble group protected by an acid labile group b.

2. A positive-working radiation-sensitive composition according to claim 1 wherein the acid labile group a with an alkali-soluble group protected by an acid labile group a has at least one phenolic hydroxyl group, or alternatively a phenolic hydroxyl group further protected with acid labile group b.

3. A positive-working radiation-sensitive composition according to claim 1 wherein the acid labile group a in the compound with an alkali-soluble group protected by an acid labile group a has at least one carboxyl group or alternatively a carboxyl group further protected with acid labile group b.

4. A positive-working radiation-sensitive composition according to claim 1 wherein the labile group a in the compound with an alkali-soluble group protected by an acid labile group a is represented by general formula (4):

($R^{13}$ to $R^{15}$ are each independently an alkyl group, a substituted alkyl group, a cycloalkyl group, an aryl group, a substituted aryl group, a group containing an alkali-soluble group, or a group containing an alkali-soluble group protected by acid labile group b, and at least one is a group containing an alkali-soluble group, or a group containing an alkali-soluble group protected by acid labile group b, $R^{13}$ to $R^{15}$ may be the same or different).

5. A positive-working radiation-sensitive composition according to claim 4 wherein at least one of $R^{13}$ to $R^{15}$ in general formula (4) is a group represented by general formula (5) or (6):

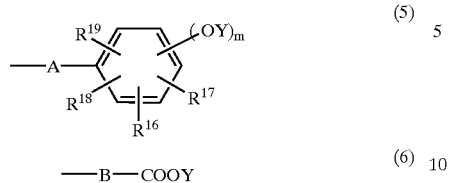

(A represents an alkylene group with 1 to 4 carbons, an arylene group with 6 to 10 carbons or a single bond, B represents an alkylene group with 1 to 6 carbons, an arylene group with 6 to 10 carbons, an alkylenearylene group with 7 to 12 carbons or a single bond, $R^{16}$ to $R^{19}$ each independently represents a hydrogen atom or an alkyl group with 1 to 4 carbons, Y represents an acid labile group b or a hydrogen atom, and m is 1 to 3).

6. A positive-working radiation-sensitive composition according to claim 4 wherein at least one of $R^{13}$ to $R^{15}$ in general formula (4) is a group represented by general formula (7):

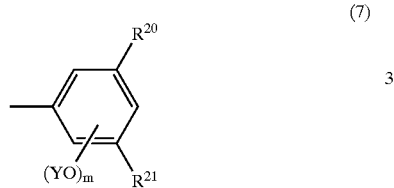

($R^{20}$ and $R^{21}$ each independently represents a hydrogen atom or an alkyl group with 1 to 4 carbons, Y represents an acid labile group b or a hydrogen atom, and m is 1 to 3).

7. A positive-working radiation-sensitive composition according to claim 4 wherein at least one of $R^{13}$ to $R^{15}$ of general formula (4) is of structure represented by general formula (8):

($R^{22}$ and $R^{23}$ represent a hydrogen atom or an alkyl group with 1 to 4 carbons, Y represents an acid labile group b or a hydrogen atom).

8. A positive-working radiation-sensitive composition according to claim 1 wherein the compound with an alkali-soluble group protected by an acid labile group a is a polymer of weight average molecular weight from 5,000 to 50,000.

9. A positive-working radiation-sensitive composition according to claim 1 wherein the compound with an alkali-soluble group protected by an acid labile group a is a polymer containing structural units represented by general formula (9):

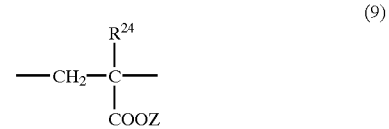

($R^{24}$ represents a hydrogen atom, an alkyl group with 1 to 4 carbons, a cyano group or a halogen, Z is a group represented by general formula (1), (2) or (4)).

10. A positive-working radiation-sensitive composition according to claim 1 wherein the compound with an alkali-soluble group protected by an acid labile group a is a polymer containing structural units represented by general formula (10):

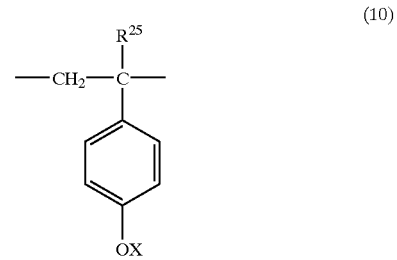

($R^{23}$ represents a hydrogen atom, an alkyl group with 1 to 4 carbons, a cyano group or a halogen, X is an acid labile group represented by general formula (2) or (4)).

11. A positive-working radiation-sensitive composition according to claim 9 wherein $R^{24}$ is a cyano group or a halogen.

12. A positive-working radiation-sensitive composition comprising a positive-working radiation-sensitive composition containing a) a compound with an alkali-soluble group protected by an acid labile group a and b) an acid generator which generates acid by irradiation with radiation, and any of the following conditions a1) to a3) are satisfied:

a1) The alkali-soluble group is a carboxyl group and the acid labile group is represented by general formula (I)

($R^1$ and $R^2$ are aromatic rings, and $R^3$ represents an alkyl group, a substituted alkyl group, a cycloalkyl group or an aromatic ring; and $R^1$ to $R^3$ may be the same or different)

a2) The acid labile group is represented by general formula (2)

($R^4$ to $R^6$ are each an alkyl group, a substituted alkyl group, a cycloalkyl group or an aromatic ring, and at least one of $R^4$ to $R^6$ is an aromatic ring with an electron-donating group; and $R^4$ to $R^6$ may be the same or different)

a3) The acid labile group a has an alkali-soluble group or alternatively the acid labile group a has an alkali-soluble group protected by an acid labile group b, and wherein the compound meeting any of conditions a1) to a3) is a polymer containing structural units represented by general formula (9):

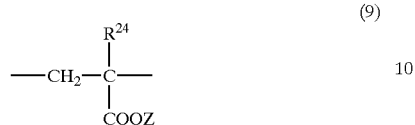

($R^{24}$ represents a hydrogen atom, an alkyl group with 1 to 4 carbons, a cyano group or a halogen, Z is a group represented by general formula (1), (2) or (4)).

13. A positive-working radiation-sensitive composition according to claim 12 wherein condition a2) or a3) is satisfied and wherein the compound meeting condition a2) or a3) is a polymer containing structural units represented by general formula (10):

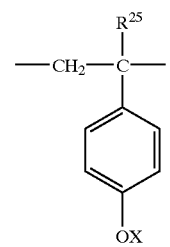

($R^{23}$ represents a hydrogen atom, an alkyl group with 1 to 4 carbons, a cyano group or a halogen, X is an acid labile group represented by general formula (2) or (4).

14. A positive-working radiation-sensitive composition according to claim 12 wherein $R^{24}$ is a cyano group or a halogen.

* * * * *